US010741242B2

(12) United States Patent
Seo et al.

(10) Patent No.: US 10,741,242 B2
(45) Date of Patent: Aug. 11, 2020

(54) MEMORY DEVICES INCLUDING VOLTAGE GENERATION CIRCUIT FOR PERFORMING BACKGROUND CALIBRATION

(71) Applicant: Samsung Electronics Co., Ltd., Suwon-si, Gyeonggi-do (KR)

(72) Inventors: Young-hun Seo, Hwaseong-si (KR); Seung-hyun Cho, Jinju-si (KR); Chang-ho Shin, Suwon-si (KR); Yong-jae Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/517,724

(22) Filed: Jul. 22, 2019

(65) Prior Publication Data

US 2020/0082872 A1 Mar. 12, 2020

(30) Foreign Application Priority Data

Sep. 7, 2018 (KR) ........................ 10-2018-0107393
Jan. 23, 2019 (KR) ........................ 10-2019-0008606

(51) Int. Cl.

| | |
|---|---|
| ***G11C 7/00*** | (2006.01) |
| ***G11C 11/4094*** | (2006.01) |
| ***G11C 11/4091*** | (2006.01) |
| ***G11C 11/4074*** | (2006.01) |
| ***G11C 11/4096*** | (2006.01) |
| ***G11C 11/4099*** | (2006.01) |

(52) U.S. Cl.

CPC ...... *G11C 11/4094* (2013.01); *G11C 11/4074* (2013.01); *G11C 11/4091* (2013.01); *G11C 11/4096* (2013.01); *G11C 11/4099* (2013.01)

(58) Field of Classification Search

CPC ............ G11C 11/4094; G11C 11/4074; G11C 11/4091; G11C 11/4096; G11C 11/4099
USPC .......................................................... 365/203
See application file for complete search history.

(56) References Cited

U.S. PATENT DOCUMENTS

| | | | |
|---|---|---|---|
| 4,943,945 | A | 7/1990 | Lai |
| 7,450,439 | B2 | 11/2008 | Lee et al. |
| 8,416,632 | B2 | 4/2013 | Kim et al. |
| 2012/0155168 | A1 | 6/2012 | Kim et al. |
| 2013/0038315 | A1 | 2/2013 | Chen et al. |

(Continued)

FOREIGN PATENT DOCUMENTS

KR 10-2015-0026711 3/2015

*Primary Examiner* — Huan Hoang
(74) *Attorney, Agent, or Firm* — Myers Bigel, P.A.

(57) ABSTRACT

Memory devices are provided. A memory device includes a voltage generation circuit that includes an offset compensator configured to receive a reference voltage and an offset code and to link the offset code to the reference voltage. The voltage generation circuit includes a comparator configured to compare the reference voltage linked to the offset code with a bit line pre-charge voltage and to output driving control signals. The voltage generation circuit includes a driver configured to output the bit line pre-charge voltage at a target level of the reference voltage in response to the driving control signals. The voltage generation circuit includes a background calibration circuit configured to generate the offset code for performing control so that a target short current flows through an output node of the driver from which the bit line pre-charge voltage is output. Related methods of generating a bit line pre-charge voltage are also provided.

20 Claims, 14 Drawing Sheets

(56) References Cited

U.S. PATENT DOCUMENTS

2014/0198587 A1 7/2014 Lines et al.
2015/0055423 A1* 2/2015 Lim ....................... G11C 7/062 365/189.07
2017/0248979 A1 8/2017 Lee et al.
2018/0294017 A1* 10/2018 Chen ........................ G11C 7/12

* cited by examiner

321 & 331
VDD
501
502
DCS1
530
540
510
520
505
VSS
VBL
VREF
OFFSET<4>
<0>
<1>
<2>
<3>
511
512
513
514
515
516
521
522
523
524
525
526
532
533
534
535
536
542
543
544
545
546

322 & 332
VBL
VDD
VSS
VREF
OFFSET<4>
DCS2
605
610
620
630
640
601
602

FIG. 8

| IREF_PD, IREF_ND | OUT_PD | OUT_ND | OFFSET<0:4> | SW |
|---|---|---|---|---|
| 5μA | 0 | 0 | UP | OFF |
| | 0 | 1 | UP | OFF |
| | 1 | 1 | UP | OFF |
| | 1 | 0 | FIX | ON |
| 15μA | 0 | 1 | FIX | ON |
| | 0 | 0 | FIX | ON |
| | 1 | 1 | FIX | ON |
| | 1 | 0 | DN | OFF |

"0"=Logic LOW
"1"=Logic HIGH

MEMORY DEVICES INCLUDING VOLTAGE GENERATION CIRCUIT FOR PERFORMING BACKGROUND CALIBRATION

CROSS-REFERENCE TO RELATED APPLICATIONS

This application claims the benefit of Korean Patent Application Nos. 10-2018-0107393, filed on Sep. 7, 2018 and 10-2019-0008606, filed on Jan. 23, 2019 in the Korean Intellectual Property Office, the disclosures of which are incorporated herein in their entirety by reference.

BACKGROUND

The present disclosure relates to semiconductor devices and, more particularly, to generating a bit line pre-charge voltage. Dynamic random access memory (DRAM) operates in a method of writing data by charges stored in a cell capacitor of a memory cell. Memory cells are connected to a bit line and a complementary bit line. When a read operation or a refresh operation is performed by the DRAM, a bit line sense amplifier senses and amplifies a voltage difference between the bit line and the complementary bit line. In order to sense data output to the bit line, the bit line is previously pre-charged by a bit line pre-charge voltage. In a case in which the bit line pre-charge voltage is unstable, when the data stored in the cell capacitor is sensed, a sensing margin may be reduced. Due to the sensing margin reduced by the unstable bit line pre-charge voltage, a sensing error of the bit line sensing amplifier occurs and the performance of the DRAM may deteriorate.

SUMMARY

The inventive concepts provide a voltage generation circuit for performing background calibration for monitoring a target short current of a driver for outputting a bit line pre-charge voltage and generating the bit line pre-charge voltage without a dead zone and a memory device including the same.

According to some embodiments of the inventive concepts, there is provided a voltage generation circuit configured to generate a bit line pre-charge voltage. The voltage generation circuit may include an offset compensator configured to receive a reference voltage and an offset code and to link the offset code to the reference voltage. The voltage generation circuit may include a comparator configured to compare the reference voltage linked to the offset code with the bit line pre-charge voltage and to output first and second driving control signals. The voltage generation circuit may include a driver configured to output the bit line pre-charge voltage at a target level of the reference voltage in response to the first and second driving control signals. Moreover, the voltage generation circuit may include a background calibration circuit configured to generate the offset code for performing control so that a target short current flows through an output node of the driver from which the bit line pre-charge voltage is output in response to the first and second driving control signals.

According to some embodiments of the inventive concepts, there is provided a memory device including a bit line sense amplifier configured to precharge a bit line and a complementary bit line by a bit line pre-charge voltage and amplify a voltage difference between the bit line and the complementary bit line. Moreover, the memory device may include a voltage generation circuit configured to generate the bit line pre-charge voltage. The voltage generation circuit may include an offset compensator configured to receive a reference voltage and an offset code and to link the offset code to the reference voltage. The voltage generation circuit may include a comparator configured to compare the reference voltage linked to the offset code with the bit line pre-charge voltage and to output first and second driving control signals. The voltage generation circuit may include a driver configured to output the bit line pre-charge voltage at a target level of the reference voltage in response to the first and second driving control signals. The voltage generation circuit may include a background calibration circuit configured to generate the offset code for performing control so that a target short current flows through an output node of the driver from which the bit line pre-charge voltage is output in response to the first and second driving control signals.

According to some embodiments of the inventive concepts, there is provided a method of generating a bit line pre-charge voltage used for pre-charging a bit line and a complementary bit line of a memory device. The method may include comparing current levels of first and second replica transistors that model a pull-up transistor and a pull-down transistor of a driver configured to output the bit line pre-charge voltage at a level of a first reference current. The method may include increasing an offset code by performing an up-counting operation until the current levels of the first and second replica transistors are higher than the level of the first reference current and then holding the offset code constant. The method may include comparing the current levels of the first and second replica transistors with a level of a second reference current that is higher than the level of the first reference current. The method may include further holding the offset code constant when the current levels of the first and second replica transistors are higher than the level of the first reference current and lower than the level of the second reference current. The method may include reducing the offset code by performing a down-counting operation when the current levels of the first and second replica transistors are higher than the level of the second reference current. Moreover, the method may include generating the bit line pre-charge voltage based on a reference voltage linked to the offset code.

BRIEF DESCRIPTION OF THE DRAWINGS

Embodiments of the inventive concepts will be more clearly understood from the following detailed description taken in conjunction with the accompanying drawings in which:

FIG. 8 is a view illustrating an operation of the background calibration circuit of FIG. 7;

DETAILED DESCRIPTION

Figure 1:
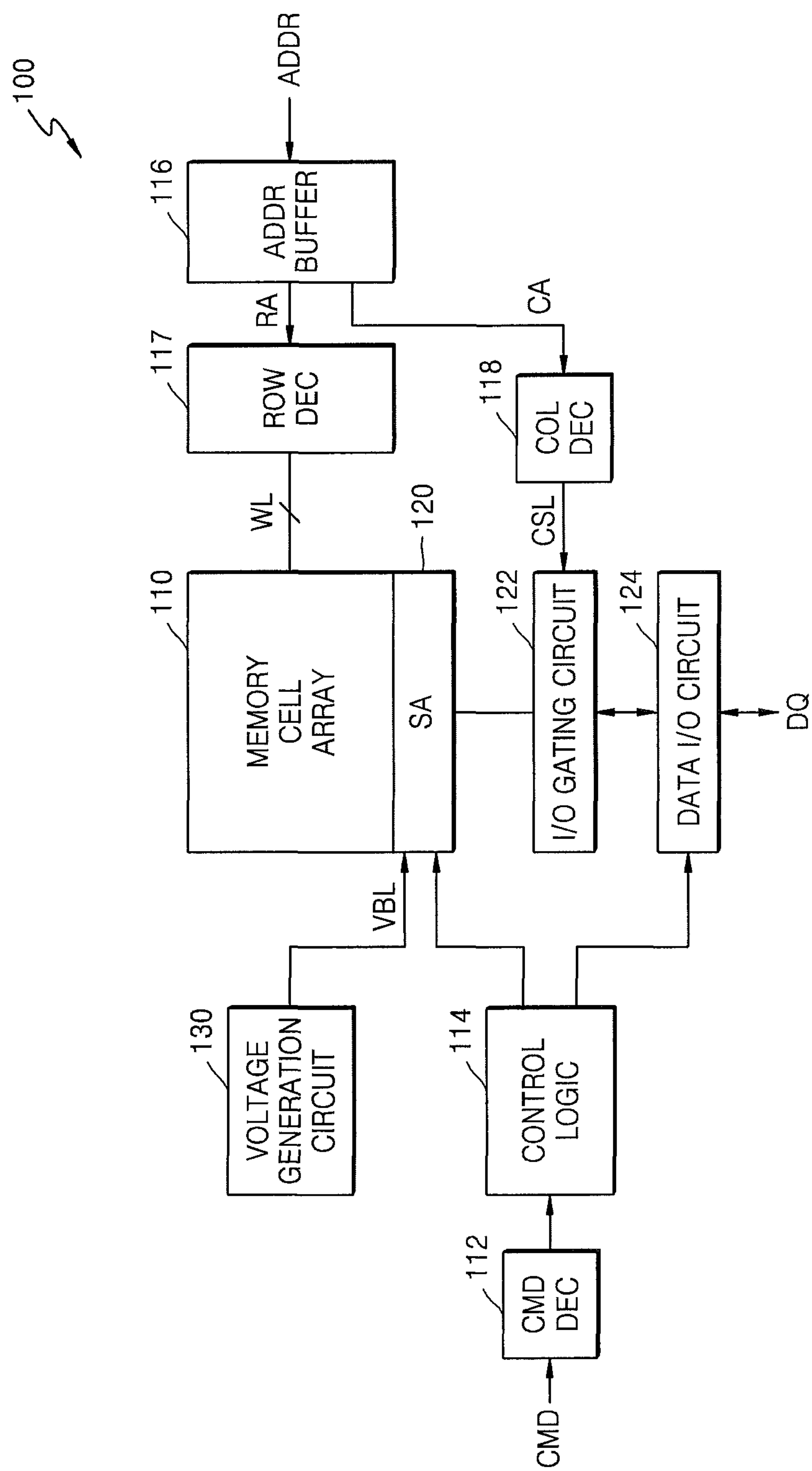
FIG. 1 is a block diagram illustrating a memory device according to some example embodiments of the inventive concepts.

FIG. 1 is a block diagram illustrating a memory device 100 according to some example embodiments of the inventive concepts.

Referring to FIG. 1, the memory device 100 may be volatile memory such as dynamic random access memory (DRAM), synchronous DRAM (SDRAM), double data rate SDRAM (DDR SDRAM), low power double data rate SDRAM (LPDDR SDRAM), graphics double data rate SDRAM (GDDR SDRAM), or thyristor RAM (TRAM). According to some embodiments, the memory device 100 may be non-volatile memory such as phase change random access memory (PRAM), magnetic random access memory (MRAM), or resistive random access memory (RRAM).

The memory device 100 receives a command CMD, an address ADDR, and/or control signals from an external device, for example, a central processing unit (CPU) or a memory controller and may input or output data through data pads DQ. The memory device 100 may include a memory cell array 110, a command decoder 112, a control logic 114, an address buffer 116, a row decoder 117, a column decoder 118, a sense amplifier block 120, an input and output gating circuit 122, a data input and output circuit 124, and a voltage generation circuit 130.

The memory cell array 110 may include a plurality of memory cells arranged in rows and columns in a matrix. The memory cell array 110 may include a plurality of word lines WL and a plurality of bit lines BL (refer to FIG. 2A) that are connected to the memory cells. The plurality of word lines WL are connected to rows of the memory cells and the plurality of bit lines BL may be connected to columns of the memory cells.

The command decoder 112 decodes a row address strobe signal, a column address strobe signal, a chip selection signal, and a write enable signal that are received from the CPU or the memory controller and accordingly, the control signals corresponding to the command CMD are generated by the control logic 114. The command CMD may include an active command, a read command, a write command, and/or a pre-charge command.

The address buffer 116 may receive the address ADDR from the CPU or the memory controller. The address ADDR may include a row address RA for addressing rows of the memory cell array 110 and a column address CA for addressing columns of the memory cell array 110. According to some embodiments, the command CMD and the address ADDR may be provided to the memory device 100 through a command address bus. The command CMD or the address ADDR may be time-serially transmitted to the command address bus. The address buffer 116 transmits the row address RA to the row decoder 117 and may transmit the column address CA to the column decoder 118.

The row decoder 117 may select one of the plurality of word lines WL connected to the memory cell array 110. The row decoder 117 selects one of the word lines WL, which corresponds to the row address RA, by decoding the row address RA received from the address buffer 116 and may activate the selected word line WL. The column decoder 118 may select predetermined bit lines BL among the plurality of bit lines BL of the memory cell array 110. The column decoder 118 generates a column selection signal CSL by decoding the column address CA received from the address buffer 116 and may select bit lines BL connected to the column selection signal CSL through the input and output gating circuit 122.

The sense amplifier block 120 may be connected to the bit lines BL of the memory cell array 110. The sense amplifier block 120 senses changes in voltages of the bit lines BL and may amplify and output the changes in voltages. The bit lines BL sensed and amplified by the sense amplifier block 120 may be selected by the input and output gating circuit 122.

The input and output gating circuit 122 may include read data latches for storing data of the bit lines BL selected by the column selection signal CSL and a write driver for writing the data in the memory cell array 110. The data stored in the read data latches may be provided to the data pads DQ through the data input and output circuit 124. The write data provided to the data input and output circuit 124 through the data pad DQ may be written in the memory cell array 110 through the write driver.

The control logic 114 generates various control signals for writing the data in the memory cell array 110 or reading the data from the memory cell array 110 based on the command CMD received through the command decoder 112 and may provide the generated control signals to the sense amplifier block 120 and/or the data input and output circuit 124.

The voltage generation circuit 130 may generate a bit line pre-charge voltage VBL used for pre-charging the bit lines BL before the sense amplifier block 120 senses and amplifies the changes in voltages of the bit lines BL. The voltage generation circuit 130 may perform a background calibration operation so that a target short current uniformly flows through an output node of a driver for outputting the bit line pre-charge voltage VBL. The background calibration operation may include an operation of comparing levels of currents that flow through first and second replica transistors with a level of a first or second reference current by using the first and second replica transistors that copy/model pull-up and pull-down transistors of the driver, an operation of generating an offset code in response to a comparison result, and an operation of outputting the bit line pre-charge voltage VBL based on (e.g., at) a reference voltage linked to the offset code. Therefore, the bit line pre-charge voltage VBL output by the voltage generation circuit 130 may have minimized/reduced distribution without a dead zone.

Figure 2A:
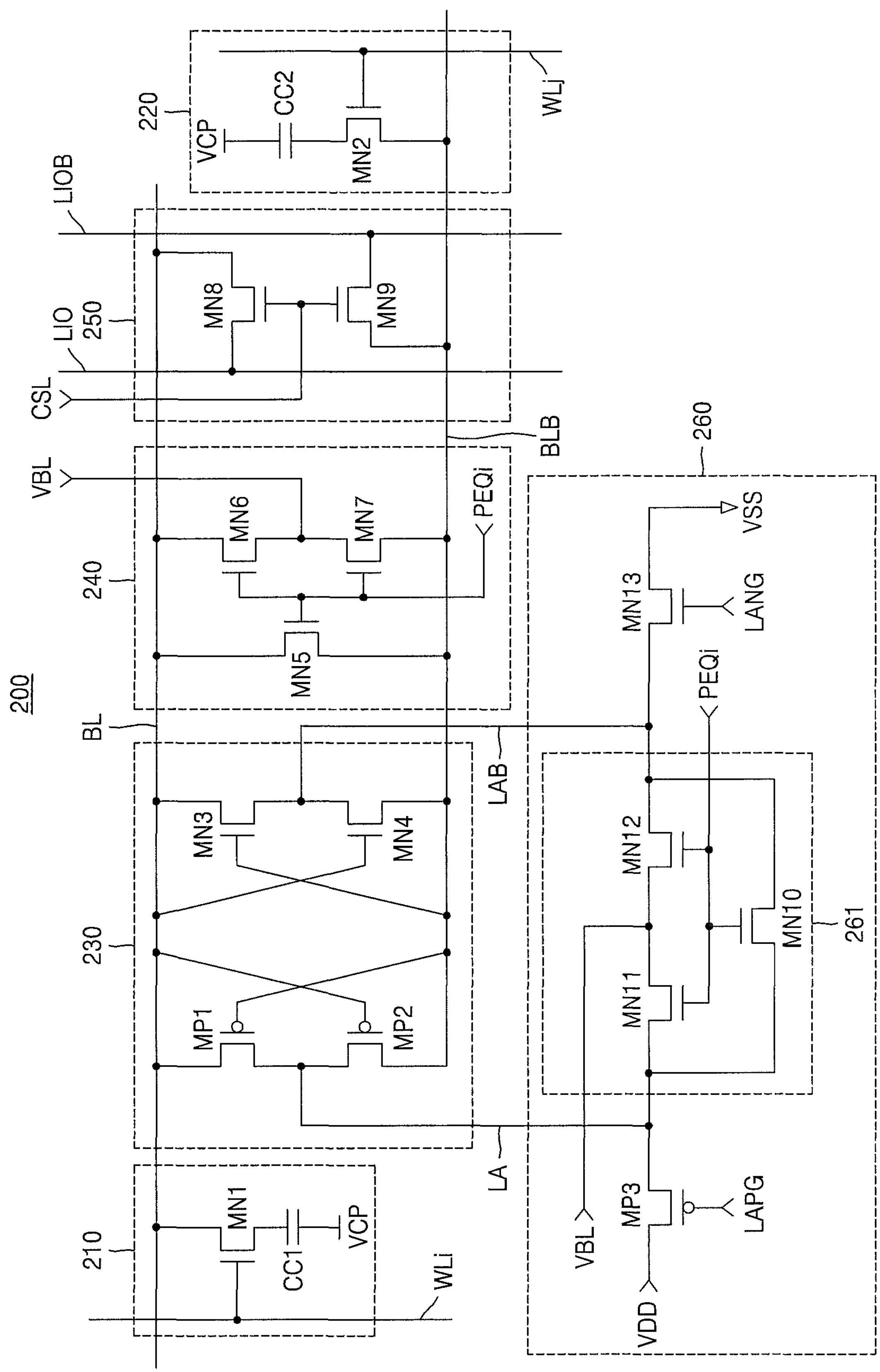
FIGS. 2A to 2C are views illustrating a configuration of a memory core region in the memory device of FIG. 1.
Figure 2B:
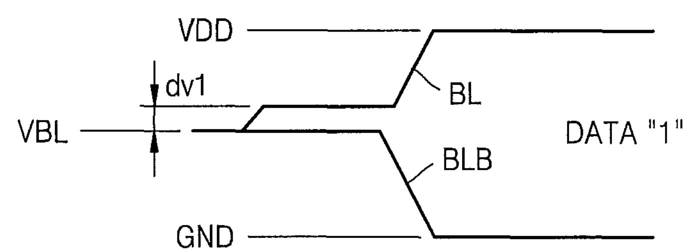

FIGS. 2A and 2B are views illustrating a configuration of a memory core region 200 in the memory device 100 of FIG. 1.

Referring to FIG. 2A, the memory core region 200 may be referred to as a region including the memory cell array 110, the control logic 114, the sense amplifier block 120, and the input and output gating circuit 122 in the memory device 100 of FIG. 1. The memory core region 200 may include a first memory cell 210 connected to a bit line BL, a second memory cell 220 connected to a complementary bit line BLB, a bit line sense amplifier 230, a first equalizer 240, a column selection circuit 250, and an amplification controller 260.

The first memory cell 210 includes a cell transistor MN1 and a cell capacitor CC1 that are serially connected to each other. The second memory cell 220 includes a cell transistor MN2 and a cell capacitor CC2 that are serially connected to each other. A cell plate voltage VCP is applied to one end of each of the cell capacitors CC1 and CC2. A drain of the cell transistor MN1 is connected to the bit line BL and a gate of the cell transistor MN1 is connected to a word line WLi. A drain of the cell transistor MN2 is connected to the complementary bit line BLB and a gate of the cell transistor MN2 is connected to the word line WLj.

The first equalizer 240 includes n-type metal-oxide-semiconductor (NMOS) transistors MN5, MN6, and MN7. The NMOS transistor MN5 is connected between the bit line BL and the complementary bit line BLB and an equalization control signal PEQi is connected to a gate of the NMOS transistor MN5. A drain of the NMOS transistor MN6 is connected to the bit line BL, a source of the NMOS transistor MN6 is connected to the bit line pre-charge voltage VBL, and a gate of the NMOS transistor MN6 is connected to the equalization control signal PEQi. The NMOS transistor MN7 is connected to the complementary bit line BLB, a source of the NMOS transistor MN7 is connected to the bit line pre-charge voltage VBL, and a gate of the NMOS transistor MN7 is connected to the equalization control signal PEQi. The first equalizer 240 pre-charges the bit line BL and the complementary bit line BLB by the bit line pre-charge voltage VBL in response to the equalization control signal PEQi.

The bit line sense amplifier 230 includes p-type metal-oxide-semiconductor (PMOS) transistors MP1 and MP2 serially connected between the bit line BL and the complementary bit line BLB and NMOS transistors MN3 and MN4 serially connected between the bit line BL and the complementary bit line BLB. The PMOS transistors MP1 and MP2 may sense and amplify a voltage difference between the bit line BL and the complementary bit line BLB by using a power voltage VDD provided by the amplification controller 260 to a first power supply line LA. The NMOS transistors MN3 and MN4 may sense and amplify a voltage difference between the bit line BL and the complementary bit line BLB by using a ground voltage VSS provided by the amplification controller 260 to a second power supply line LAB.

The column selection circuit 250 includes NMOS transistors MN8 and MN9. The NMOS transistor MN8 may electrically connect the bit line BL to a local input and output line LIO in response to the column selection signal CSL. The NMOS transistor MN9 may electrically connect the complementary bit line BLB to a complementary local input and output line LIOB in response to the column selection signal CSL.

The amplification controller 260 includes a second equalizer 261, a PMOS transistor MP3, and an NMOS transistor MN13. The second equalizer 261 includes NMOS transistors MN10, MN11, and MN12. The equalization control signal PEQi is connected to gates of the NMOS transistors MN10, MN11, and MN12 and the bit line pre-charge voltage VBL is connected to sources of the NMOS transistors MN11 and MN12. The second equalizer 261 is connected to sources of the PMOS transistors MP1 and MP2 of the bit line sense amplifier 230 through the first power supply line LA and is connected to sources of the NMOS transistors MN3 and MN4 of the bit line sense amplifier 230 through the second power supply line LAB. The second equalizer 261 pre-charges the first power supply line LA and the second power supply line LAB by the bit line pre-charge voltage VBL in response to the equalization control signal PEQi. The PMOS transistor MP3 provides the power voltage VDD to the bit line sense amplifier 230 through the first power supply line LA in response to a first switch control signal LAPG. The NMOS transistor MN13 provides the ground voltage VSS to the bit line sense amplifier 230 through the second power supply line LAB in response to a second switch control signal LANG.

When data stored in the cell capacitor CC1 of the first memory cell 210 is output to the bit line BL, charge sharing may occur between the cell capacitor CC1 and a capacitor of the bit line BL. When data stored in the cell capacitor CC2 of the second memory cell 220 is output to the complementary bit line BLB, charge sharing may occur between the cell capacitor CC2 and a capacitor of the complementary bit line BLB. In order to efficiently sense data stored in the first and second memory cells 210 and 220, the bit line BL and the complementary bit line BLB may be previously pre-charged by the bit line pre-charge voltage VBL.

Figure 2C:
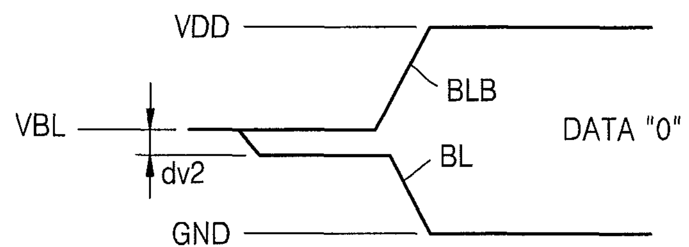

FIGS. 2B and 2C illustrate voltage waveforms of the bit line BL and the complementary bit line BLB when data “1” or “0” stored in the cell capacitor CC1 of the first memory cell 210 is sensed. In FIG. 2B, when the bit line sense amplifier 230 senses the data “1”, after the bit line BL and the complementary bit line BLB are pre-charged by the bit line pre-charge voltage VBL, a voltage level of the bit line BL may increase by dV1 due to charge sharing between the cell capacitor CC1 and the capacitor of the bit line BL. When an amplification operation is completed by the bit line sense amplifier 230, a voltage of the bit line BL is at a level of the power voltage VDD and the complementary bit line BLB may be at a level of the ground voltage VSS.

In FIG. 2C, when the bit line sense amplifier 230 senses the data “0”, after the bit line BL and the complementary bit line BLB are pre-charged by the bit line pre-charge voltage VBL, the voltage level of the bit line BL may be reduced by dV2 due to charge sharing between the cell capacitor CC1 and the capacitor of the bit line BL. When the amplification operation is completed by the bit line sense amplifier 230, the voltage of the bit line BL is at the level of the ground voltage VSS and the complementary bit line BLB may be at the level of the power voltage VDD.

In the sense amplification waveforms of FIGS. 2B and 2C, when the bit line pre-charge voltage VBL has a uniform target level, voltage differences between dV1 and dV2 may almost equal. Therefore, in sensing the data “1” or the data “0”, charge sharing amounts of the data “1” and the data “0” equal and accordingly, the same sensing margin may be secured.

Figure 3:
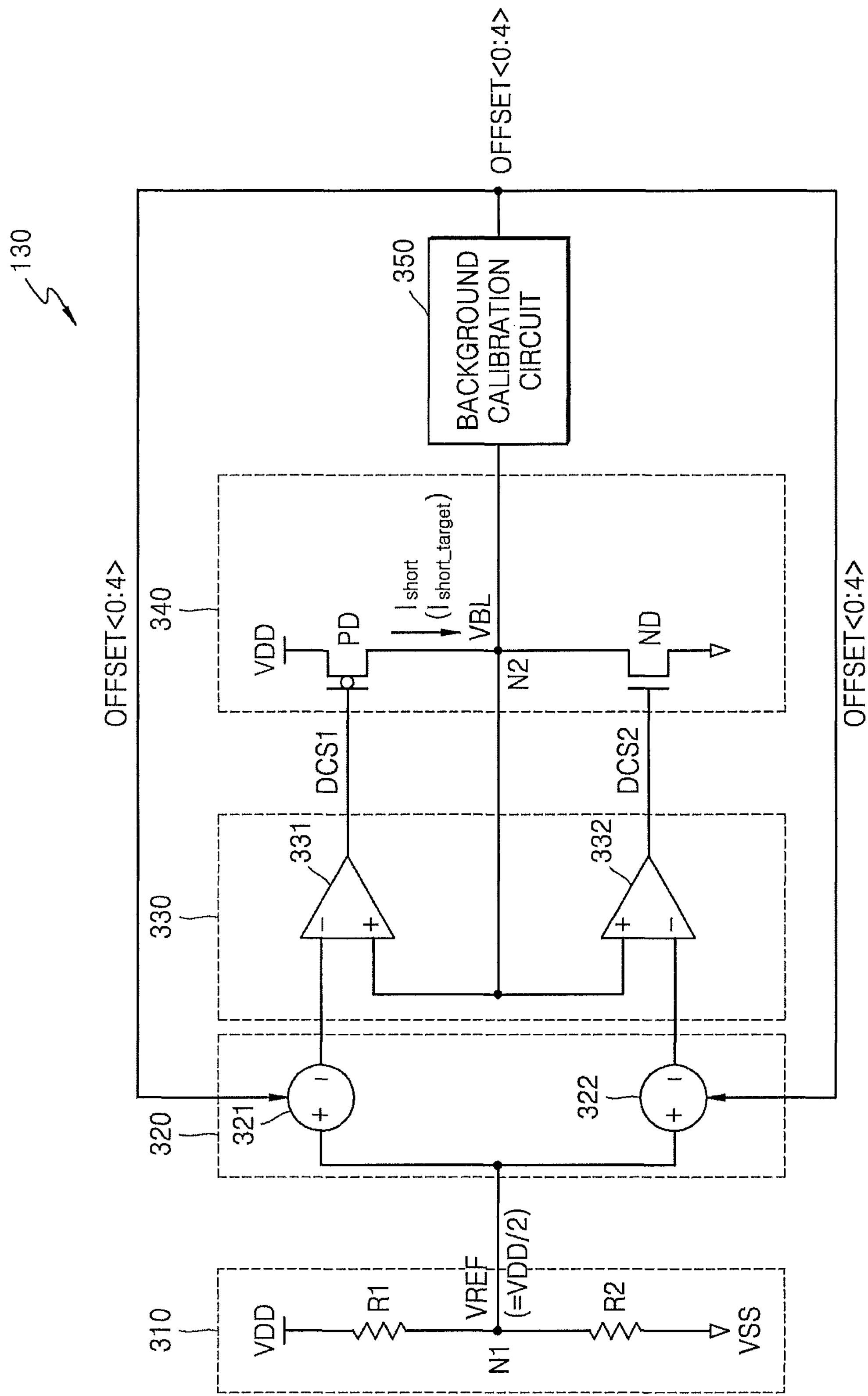
FIG. 3 is a circuit diagram illustrating a voltage generation circuit of FIG. 1.
Figure 4A:
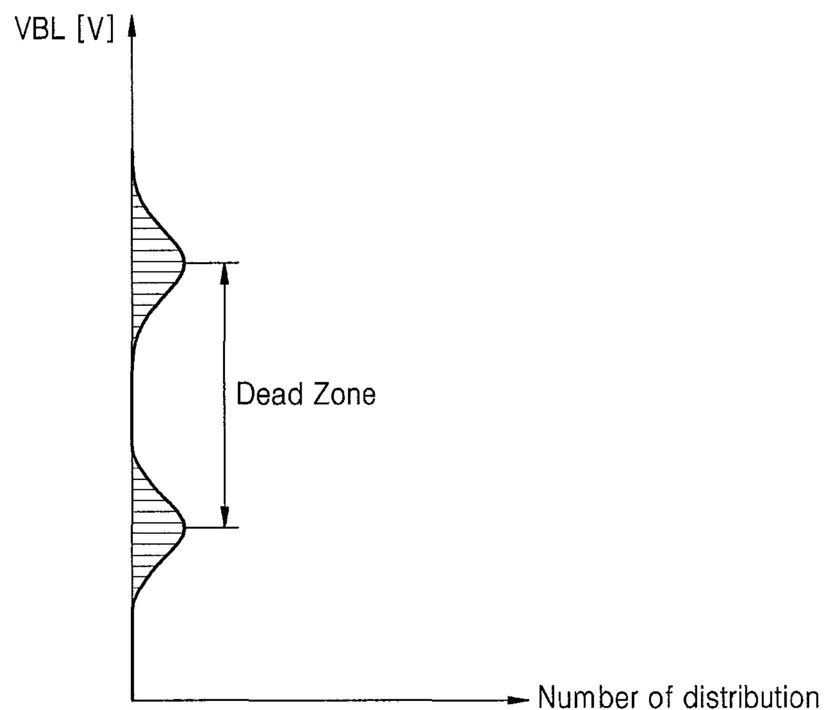
FIGS. 4A and 4B are graphs illustrating a characteristic of a bit line pre-charge voltage output from the voltage generation circuit of FIG. 3.
Figure 4B:
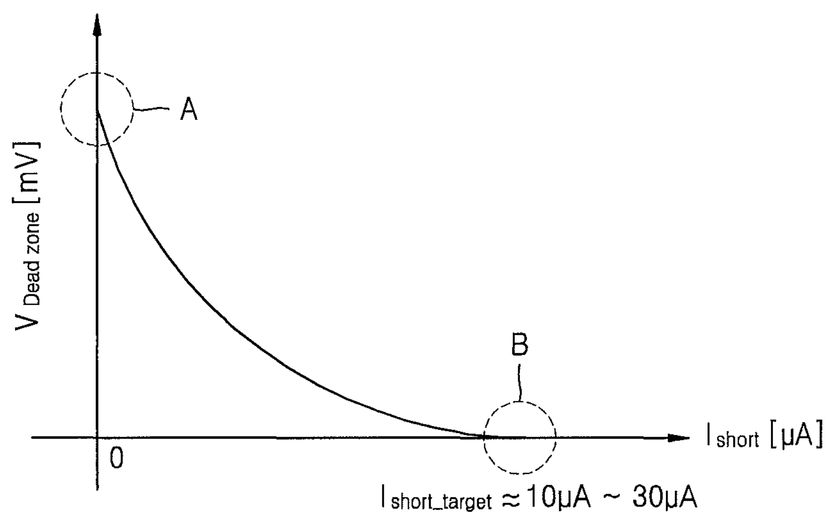

FIG. 3 is a circuit diagram illustrating the voltage generation circuit 130 of FIG. 1. FIGS. 4A and 4B are graphs illustrating a characteristic of a bit line pre-charge voltage output from the voltage generation circuit 130 of FIG. 3.

Referring to FIG. 3, the voltage generation circuit 130 includes a reference voltage generator 310, an offset compensator 320, a comparator 330, a driver 340, and a background calibration circuit 350. The reference voltage generator 310 may include first and second resistors R1 and R2 serially connected between the power voltage VDD and the ground voltage VSS, which may also be designated as GND (FIGS. 2B and 2C). The reference voltage generator 310 may output a reference voltage VREF from a first connection node N1 between the first and second resistors R1 and R2. A resistance value of the first resistor R1 and a resistance value of the second resistor R2 are set to be equal and accordingly, the reference voltage VREF may be output to have a level VDD/2 corresponding to a half (½) of the level of the power voltage VDD.

The offset compensator 320 may receive the reference voltage VREF output from the reference voltage generator 310 and an offset code OFFSET<0:4> output from the background calibration circuit 350. The offset compensator 320 may link (e.g., add or otherwise combine) the offset code OFFSET<0:4> to the reference voltage VREF. The offset compensator 320 may include a first offset compensator 321 and a second offset compensator 322. The reference voltage VREF linked to the offset code OFFSET<0:4> by the first and second offset compensators 321 and 322 may be provided to the comparator 330.

The comparator 330 compares the reference voltage VREF linked to the offset code OFFSET<0:4> with the bit line pre-charge voltage VBL and may output a first driving control signal DCS1 and a second driving control signal DCS2. The comparator 330 includes a first comparator 331 and a second comparator 332. The first comparator 331 combined with the first offset compensator 321 compares the reference voltage VREF linked to the offset code OFFSET<0:4> with the bit line pre-charge voltage VBL and may output the first driving control signal DCS1. The second comparator 332 combined with the second offset compensator 322 compares the reference voltage VREF linked to the offset code OFFSET<0:4> with the bit line pre-charge voltage VBL and may output the second driving control signal DCS2.

The driver 340 may output the bit line pre-charge voltage VBL in response to the first driving control signal DCS1 and the second driving control signal DCS2. The driver 340 includes a first transistor PD and a second transistor ND that are connected between the power voltage VDD and the ground voltage VS S. The driver 340 may output the bit line pre-charge voltage VBL from/at a second connection node N2 between the first and second transistors PD and ND. The first transistor PD may be a PMOS transistor and the second transistor ND may be an NMOS transistor. The first transistor PD pull-up drives the second connection node N2 in response to the first driving control signal DCS1 and the second transistor ND may pull-down drive the second connection node N2 in response to the second driving control signal DCS2.

Due to a connection relationship among the first comparator 331, the second comparator 332, the first transistor PD, and the second transistor ND, the bit line pre-charge voltage VBL may have the distribution including the dead zone as illustrated in FIG. 4A. The dead zone may prevent/impede the first and second transistors PD and ND from being simultaneously turned on. Short currents Ishort of the first and second transistors PD and ND in the dead zone almost represent zero (0) (A of FIG. 4B).

However, when the bit line pre-charge voltage VBL is positioned in the dead zone, since the bit line pre-charge voltage VBL is in a metastable state, the bit line pre-charge voltage VBL may have wide distribution as illustrated in FIG. 4A. When the bit line pre-charge voltage VBL having wide distribution is applied to the bit line BL and the complementary bit line BLB, in sensing the data "1" or the data "0" described in FIGS. 2B and 2C, a charge sharing amount of one of the data "1" and the data "0" deteriorates and accordingly, the sensing margin may be reduced.

In order to remove the dead zone of the bit line pre-charge voltage VBL output from the driver 340, the background calibration circuit 350 may perform control so that a target short current $I_{short\_target}$ flows through the first and second transistors PD and ND of the driver 340. The background calibration circuit 350 is connected to the driver 340 and may generate the offset code OFFSET<0:4> so that the target short current $I_{short\_target}$ flows through the driver 340. The offset code OFFSET<0:4> is provided to the offset compensator 320. The comparator 330 combined with the offset compensator 320 compares the reference voltage VREF linked to the offset code OFFSET<0:4> with the bit line pre-charge voltage VBL and may output the first and second driving control signals DCS1 and DCS2. The driver 340 may output the bit line pre-charge voltage VBL without the dead zone to the first and second transistors PD and ND through which the target short current $I_{short\_target}$ flows in response to the first and second driving control signals DCS1 and DCS2 (B of FIG. 4B). For example, the target short current $I_{short\_target}$ that flows through the first and second transistors PD and ND may be set to be 10 microamperes (μA) to 30 μA.

FIGS. 5A, 5B, 6A, and 6B are views illustrating the offset compensator 320 and the comparator 330 of FIG. 3.

Figure 5A:
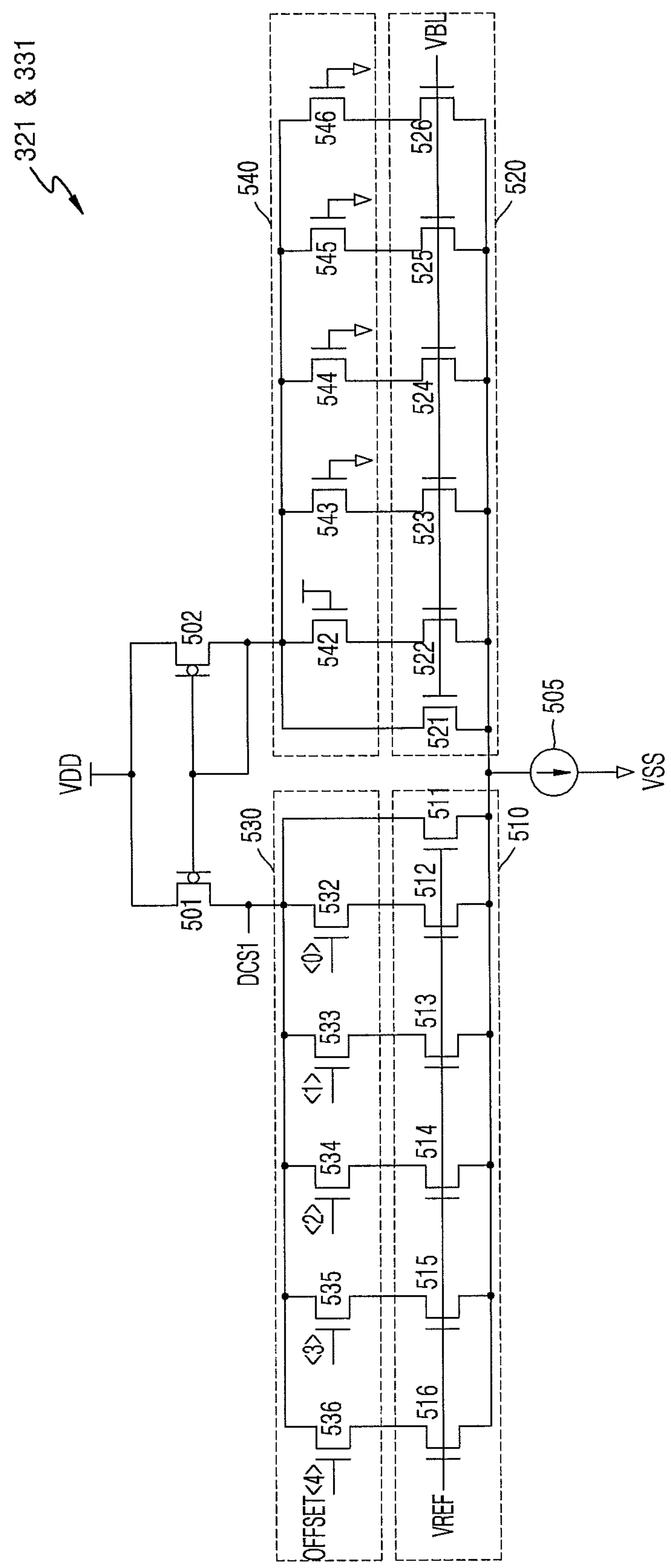
FIGS. 5A, 5B, 6A, and 6B are views illustrating an offset compensator and a comparator of FIG. 3.

Referring to FIG. 5A, the first offset compensator 321 and the first comparator 331 for comparing the reference voltage VREF linked to the offset code OFFSET<0:4> with the bit line pre-charge voltage VBL and outputting the first driving control signal DCS1 are illustrated. The first offset compensator 321 and the first comparator 331 may include first and second PMOS transistors 501 and 502, first and second input units 510 and 520, first and second offset controllers 530 and 540, and a current source 505.

The first and second PMOS transistors 501 and 502 may configure/provide a current mirror. Sources of the first and second PMOS transistors 501 and 502 are connected to the power voltage VDD and a gate of the first PMOS transistor 501 may be connected to a gate and a drain of the second PMOS transistor 502.

The first and second input units 510 and 520 configure/provide a differential amplifier and may input the reference voltage VREF and the bit line pre-charge voltage VBL and compare the reference voltage VREF with the bit line pre-charge voltage VBL. The first input unit 510 may include a plurality of NMOS transistors 511, 512, 513, 514, 515, and 516 connected in parallel. Gates of the NMOS transistors 511, 512, 513, 514, 515, and 516 are connected to the reference voltage VREF and sources of the NMOS transistors 511, 512, 513, 514, 515, and 516 may be electrically connected to the ground voltage VSS through the current source 505. A drain of the NMOS transistor 511 is connected to a drain of the first PMOS transistor 501 and may output the first driving control signal DCS1. Sizes of the NMOS transistors 511, 512, 513, 514, 515, and 516 may be designed to vary. For example, the sizes of the NMOS transistors 511, 512, 513, 514, 515, and 516 may be designed to have a ratio of 20:16:8:4:2:1.

The second input unit 520 may include a plurality of NMOS transistors 521, 522, 523, 524, 525, and 526 connected in parallel. Gates of the NMOS transistors 521, 522, 523, 524, 525, and 526 are connected to the bit line pre-charge voltage VBL and sources of the NMOS transistors 521, 522, 523, 524, 525, and 526 may be electrically connected to the ground voltage VSS through the current source 505. A drain of the NMOS transistor 521 may be connected to the gate and the drain of the second PMOS transistor 502. The NMOS transistors 521, 522, 523, 524, 525, and 526 are respectively connected to the NMOS transistors 511, 512, 513, 514, 515, and 516 of the first input unit 510. The sizes of the NMOS transistors 521, 522, 523, 524, 525, and 526 may be designed to have a ratio of 20:16:8:4:2:1.

The first offset controller 530 may include a plurality of NMOS transistors 532, 533, 534, 535, and 536 connected in parallel. Drains of the NMOS transistors 532, 533, 534, 535, and 536 may be connected to the first driving control signal DCS1 to which the drain of the first PMOS transistor 501 is connected. Gates of the NMOS transistors 532, 533, 534, 535, and 536 may be connected to the offset code OFFSET<0:4>. Sources of the NMOS transistors 532, 533, 534, 535, and 536 may be respectively connected to drains of the NMOS transistors 512, 513, 514, 515, and 516 of the first input unit 510. The NMOS transistors 532, 533, 534, 535, and 536 may be designed to have the same sizes as those of the NMOS transistors 512, 513, 514, 515, and 516 respectively connected to the NMOS transistors 532, 533, 534, 535, and 536. For example, the sizes of the NMOS transistors 532, 533, 534, 535, and 536 may be designed to have a ratio of 16:8:4:2:1.

The second offset controller 540 may include a plurality of NMOS transistors 542, 543, 544, 545, and 546 connected in parallel. Drains of the NMOS transistors 542, 543, 544, 545, and 546 may be connected to a drain and a gate of the second PMOS transistor 502. A gate of the NMOS transistor 542 is connected to the power voltage VDD and gates of the NMOS transistors 543, 544, 545, and 546 may be connected to the ground voltage VSS. Sources of the NMOS transistors 542, 543, 544, 545, and 546 may be respectively connected to drains of the NMOS transistors 522, 523, 524, 525, and 526 of the second input unit 520. The sizes of the NMOS transistors 542, 543, 544, 545, and 546 may be designed to be the same as those of the NMOS transistors 522, 523, 524, 525, and 526 respectively connected to the NMOS transistors 542, 543, 544, 545, and 546. For example, the sizes of the NMOS transistors 542, 543, 544, 545, and 546 may be designed to have a ratio of 16:8:4:2:1.

In the first offset compensator 321 and the first comparator 331, configurations of the first input unit 510 and the first offset controller 530 to which the reference voltage VREF is input are symmetrical with configurations of the second input unit 520 and the second offset controller 540 to which the bit line pre-charge voltage VBL is input, which prevents/impedes an impedance mismatch influence from occurring in comparing the reference voltage VREF with the bit line pre-charge voltage VBL and accordingly, sensitivity may improve.

Figure 5B:
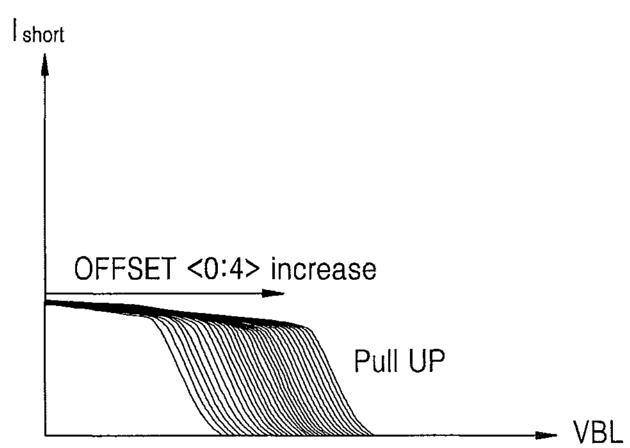

In the first offset compensator 321 and the first comparator 331, as the offset code OFFSET<0:4> increases, a voltage level of the first driving control signal DCS1 may fall. Therefore, as illustrated in FIG. 5B, as the offset code OFFSET<0:4> increases, a pull-up strength of the first transistor PD of the driver 340 increases and accordingly, a level of the bit line pre-charge voltage VBL may rise. In contrast, as the offset code OFFSET<0:4> is reduced, a pull-up strength of the first transistor PD of the driver 340 is reduced and accordingly, the level of the bit line pre-charge voltage VBL may fall.

Figure 6A:
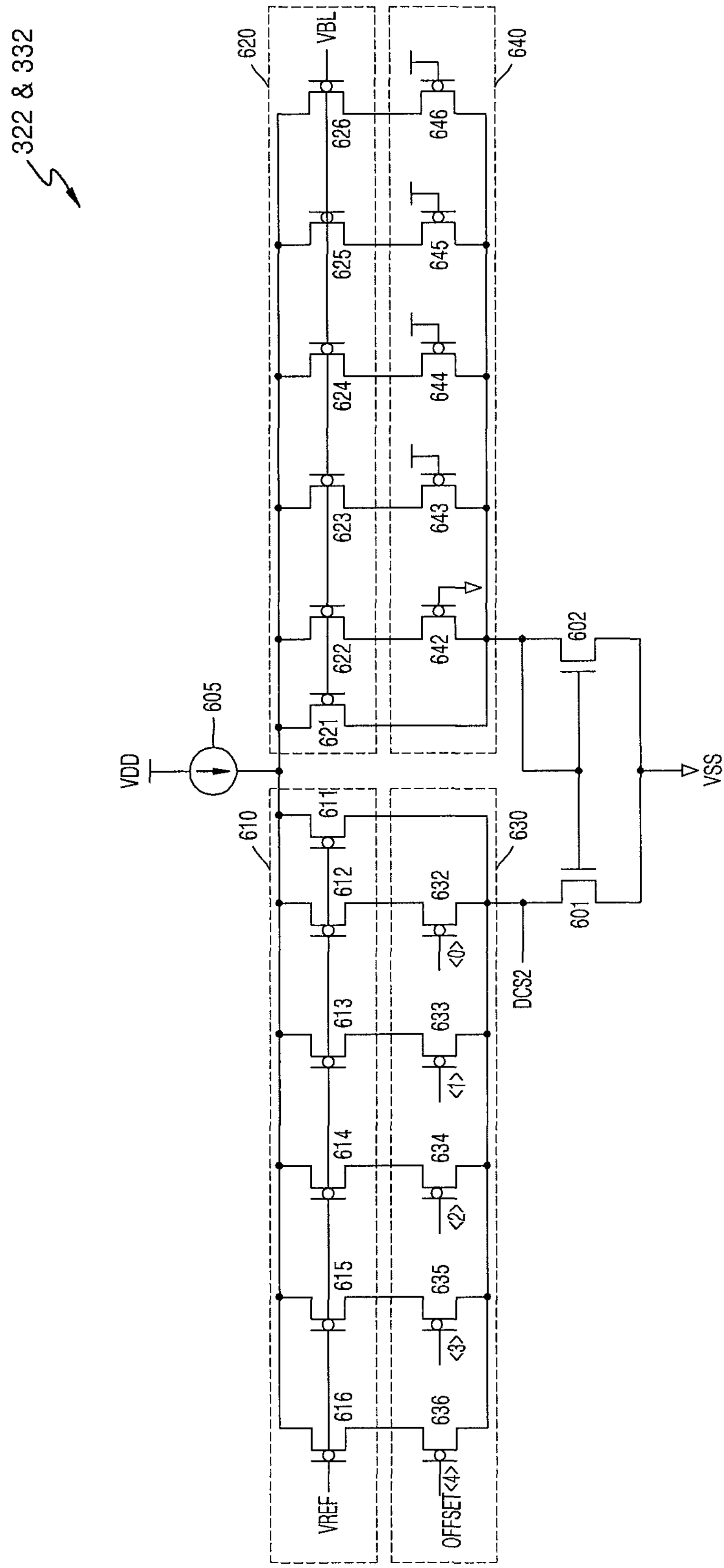

Referring to FIG. 6A, the second offset compensator 322 and the second comparator 332 for comparing the reference voltage VREF linked to the offset code OFFSET<0:4> with the bit line pre-charge voltage VBL and outputting the second driving control signal DCS2 are illustrated. The second offset compensator 322 and the second comparator 332 may include first and second NMOS transistors 601 and 602, third and fourth input units 610 and 620, third and fourth offset controllers 630 and 640, and a current source 605.

The first and second NMOS transistors 601 and 602 may configure/provide a current mirror. Sources of the first and second NMOS transistors 601 and 602 are connected to the ground voltage VSS and a gate of the first NMOS transistor 601 may be connected to a gate and a drain of the second NMOS transistor 602.

The third and fourth input units 610 and 620 configure/provide a differential amplifier and may input the reference voltage VREF and the bit line pre-charge voltage VBL and compare the reference voltage VREF with the bit line pre-charge voltage VBL. The third input unit 610 may include a plurality of PMOS transistors 611, 612, 613, 614, 615, and 616 connected in parallel. Gates of the PMOS transistors 611, 612, 613, 614, 615, and 616 are connected to the reference voltage VREF and sources of the PMOS transistors 611, 612, 613, 614, 615, and 616 may be electrically connected to the power voltage VDD through the current source 605. A drain of the PMOS transistor 611 is connected to a drain of the first NMOS transistor 601 and may output the second driving control signal DCS2. Sizes of the PMOS transistors 611, 612, 613, 614, 615, and 616 may be designed to vary. For example, the sizes of the PMOS transistors 611, 612, 613, 614, 615, and 616 may be designed to have a ratio of 20:16:8:4:2:1.

The fourth input unit 620 may include a plurality of PMOS transistors 621, 622, 623, 624, 625, and 626 connected in parallel. Gates of the PMOS transistors 621, 622, 623, 624, 625, and 626 are connected to the bit line pre-charge voltage VBL and sources of the PMOS transistors 621, 622, 623, 624, 625, and 626 may be electrically connected to the power voltage VDD through the current source 605. A drain of the PMOS transistor 621 may be connected to the gate and the drain of the second NMOS transistor 602. The PMOS transistors 621, 622, 623, 624, 625, and 626 are respectively connected to the PMOS transistors 611, 612, 613, 614, 615, and 616 of the third input unit 610. The sizes of the PMOS transistors 621, 622, 623, 624, 625, and 626 may be designed to have a ratio of 20:16:8:4:2:1.

The third offset controller 630 may include a plurality of PMOS transistors 632, 633, 634, 635, and 636 connected in parallel. Drains of the PMOS transistors 632, 633, 634, 635, and 636 may be connected to the second driving control signal DCS2 to which the drain of the first NMOS transistor 601 is connected. Gates of the PMOS transistors 632, 633, 634, 635, and 636 may be connected to the offset code OFFSET<0:4>. Sources of the PMOS transistors 632, 633, 634, 635, and 636 may be respectively connected to drains of the PMOS transistors 612, 613, 614, 615, and 616 of the third input unit 610. The PMOS transistors 632, 633, 634, 635, and 636 may be designed to have the same sizes as those of the PMOS transistors 612, 613, 614, 615, and 616 respectively connected to the PMOS transistors 632, 633, 634, 635, and 636. For example, the sizes of the PMOS transistors 632, 633, 634, 635, and 636 may be designed to have a ratio of 16:8:4:2:1.

The fourth offset controller 640 may include a plurality of PMOS transistors 642, 643, 644, 645, and 646 connected in parallel. Drains of the PMOS transistors 642, 643, 644, 645, and 646 may be connected to a drain and a gate of the second NMOS transistor 602. A gate of the PMOS transistor 642 is connected to the ground voltage VSS and gates of the PMOS transistors 643, 644, 645, and 646 may be connected to the power voltage VDD. Sources of the PMOS transistors 642, 643, 644, 645, and 646 may be respectively connected to drains of the PMOS transistors 622, 623, 624, 625, and 626 of the fourth input unit 620. The sizes of the PMOS transistors 642, 643, 644, 645, and 646 may be designed to be the same as those of the PMOS transistors 622, 623, 624, 625, and 626 respectively connected to the PMOS transistors 642, 643, 644, 645, and 646. For example, the sizes of the PMOS transistors 642, 643, 644, 645, and 646 may be designed to have a ratio of 16:8:4:2:1.

In the second offset compensator 322 and the second comparator 332, configurations of the third input unit 610 and the third offset controller 630 to which the reference voltage VREF is input are symmetrical with configurations of the fourth input unit 620 and the fourth offset controller 640 to which the bit line pre-charge voltage VBL is input, which prevents/impedes an impedance mismatch influence from occurring in comparing the reference voltage VREF with the bit line pre-charge voltage VBL and accordingly, sensitivity may improve.

Figure 6B:
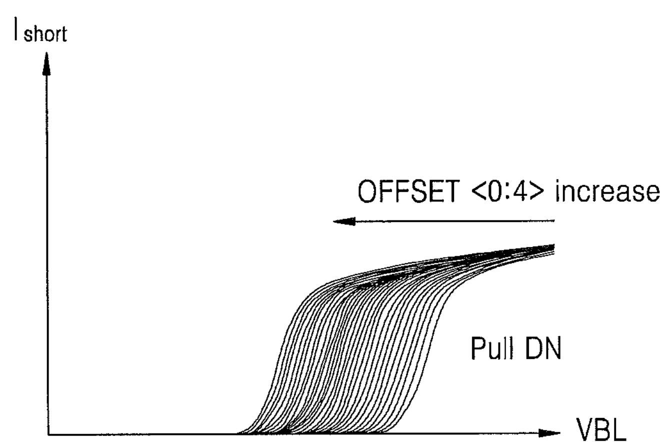

In the second offset compensator 322 and the second comparator 332, as the offset code OFFSET<0:4> increases, a voltage level of the second driving control signal DCS2 may fall. Therefore, as illustrated in FIG. 6B, as the offset code OFFSET<0:4> increases, a pull-down strength of the second transistor ND of the driver 340 is reduced and accordingly, the level of the bit line pre-charge voltage VBL may fall. In contrast, as the offset code OFFSET<0:4> is reduced, the pull-down strength of the second transistor ND of the driver 340 increases and accordingly, the level of the bit line pre-charge voltage VBL may rise.

The first and second offset compensators 321 and 322 and the first and second comparators 331 and 332 of FIGS. 5A and 6A compare the reference voltage VREF with the bit line pre-charge voltage VBL in accordance with the offset code OFFSET<0:4> and may generate the first and second driving control signals DCS1 and DCS2. The driver 340 that receives the first and second driving control signals DCS1 and DCS2 may output the bit line pre-charge voltage VBL for the reference voltage VREF. The offset code OFFSET<0:4> may be provided by the background calibration circuit 350 that performs control so that the target short current $I_{short\_target}$ uniformly flows through the second connection node N2 of the driver 340 from which the bit line pre-charge voltage VBL is output.

Figure 7:
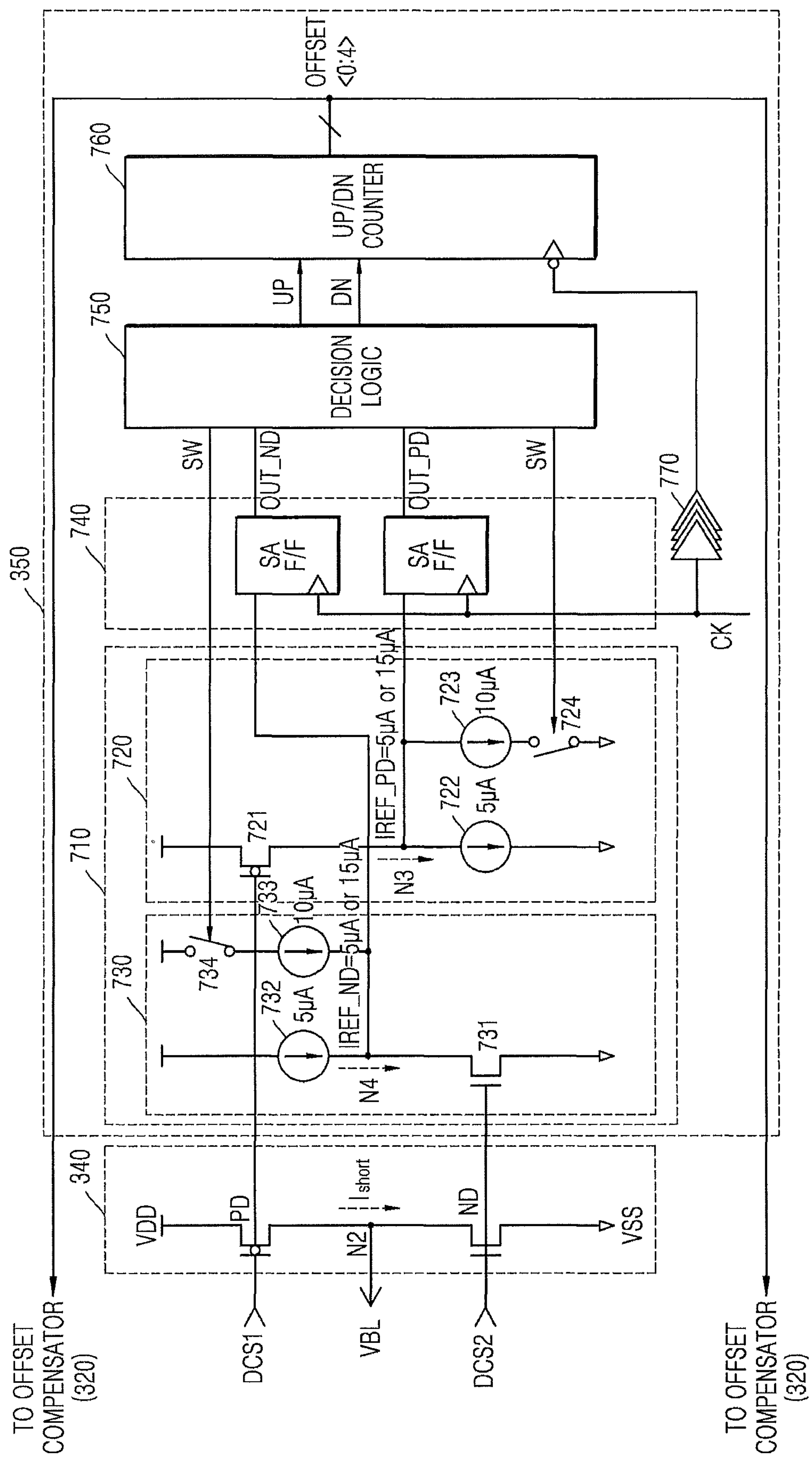
FIG. 7 is a circuit diagram illustrating a background calibration circuit of FIG. 3.

FIG. 7 is a circuit diagram illustrating the background calibration circuit 350 of FIG. 3. FIG. 8 is a view illustrating an operation of the background calibration circuit 350 of FIG. 7.

Referring to FIG. 7, the background calibration circuit 350 may generate the offset code OFFSET<0:4> that operates as a control signal for having the target short current $I_{short\_target}$ flow through the first transistor PD and the second transistor ND of the driver 340 in response to the first and second driving control signals DCS1 and DCS2 output from the comparator 330 (FIG. 3). The background calibration circuit 350 may include a driving replica unit 710, a flip-flop unit 740, a decision logic 750, an up/down counter 760, and a clock delay unit 770.

The driving replica unit 710 may include a first replica circuit 720 and a second replica circuit 730. The first replica circuit 720 copies/models the first transistor PD that is a pull-up driver of the driver 340, and the second replica circuit 730 may copy/model the second transistor ND that is a pull-down driver of the driver 340.

The first replica circuit 720 may include a first replica transistor 721, first and second pull-up current sources 722 and 723, and a first switch 724. The first replica transistor 721 may be copied/modeled like the first transistor PD of the driver 340. Therefore, a current level of the first replica transistor 721 may be determined based on a current level of the first transistor PD.

The first transistor PD and the first replica transistor 721 may determine current levels of the first transistor PD and the first replica transistor 721 by using a transistor size ratio. According to some embodiments, a size of the first replica transistor 721 may be designed to be about a half (½) of a size of the first transistor PD. In this case, a current that flows through the first transistor PD may be twice (i.e., an integer multiple of) a current that flows through the first replica transistor 721. For example, when the current that flows through the first replica transistor 721 is set to be about 5 μA, the current that flows through the first transistor PD may be about 10 μA and, when the current that flows through the first replica transistor 721 is set to be about 15 μA, the current that flows through the first transistor PD may be about 30 μA.

The first replica transistor 721 is connected between the power voltage VDD and a third connection node N3, and the first driving control signal DC S1 may be connected to a gate of the first replica transistor 721. The first pull-up current source 722 is connected between the third connection node N3 and the ground voltage VSS and may sink a first current level to the third connection node N3 as a default. For example, the first current level of the first pull-up current source 722 may be set to be about 5 μA. The second pull-up current source 723 and the first switch 724 may be serially connected between the third connection node N3 and the ground voltage VSS. When the first switch 724 is turned on (e.g., is closed), the second pull-up current source 723 may sink a second current level to the third connection node N3. For example, the second current level of the second pull-up current source 723 may be set to be about 10 μA. The first switch 724 may be turned on or off in response to a switching signal SW output from the decision logic 750.

In the first replica circuit 720, a voltage level of the third connection node N3 may be determined by the current level of the first replica transistor 721 and current levels of the first and/or second pull-up current sources 722 and 723. When a current of the first replica transistor 721 is lower than currents of the first and/or second pull-up current sources 722 and 723, the voltage level of the third connection node N3 may be toward the level of the ground voltage VSS. When the current of the first replica transistor 721 is higher than the currents of the first and/or second pull-up current sources 722 and 723, the voltage level of the third connection node N3 may be toward the level of the power voltage VDD.

The second replica circuit 730 may include a second replica transistor 731, first and second pull-down current sources 732 and 733, and a second switch 734. The second replica transistor 731 may be copied/modeled like the second transistor ND of the driver 340. Therefore, a current level of the second replica transistor 731 may be determined based on the current level of the second transistor ND.

The second transistor ND and the second replica transistor 731 may determine current levels of the second transistor ND and the second replica transistor 731 by using a transistor size ratio. According to some embodiments, a size of the second replica transistor 731 may be designed to be about a half (½) of the size of the second transistor ND. In this case, a current that flows through the second transistor ND may be twice a current that flows through the second replica transistor 731. For example, when the current that flows through the second replica transistor 731 is set to be about 5 μA, the current that flows through the second transistor ND may be about 10 μA and, when the current that flows through the second replica transistor 731 is set to be about 15 μA, the current that flows through the second transistor ND may be about 30 μA.

The second replica transistor 731 is connected between a fourth connection node N4 and the ground voltage VSS, and the second driving control signal DCS2 may be connected to a gate of the second replica transistor 731. The first pull-up current source 732 is connected between the power voltage VDD and the fourth connection node N4 and may supply the first current level to the fourth connection node N4 as a default. For example, the first current level of the first pull-down current source 732 may be set to be about 5 μA.

The second switch 734 and the second pull-down current source 733 may be serially connected between the power voltage VDD and the fourth connection node N4. When the second switch 734 is turned on (e.g., is closed), the second pull-down current source 733 may supply the second current level to the fourth connection node N4. For example, the second current level of the second pull-down current source 733 may be set to be about 10 μA. The second switch 734 may be turned on or off in response to the switching signal SW output from the decision logic 750.

In the second replica circuit 730, a voltage level of the fourth connection node N4 may be determined by the current level of the second replica transistor 731 and current levels of the first and/or second pull-down current sources 732 and 733. When a current of the second replica transistor 731 is lower than currents of the first and/or second pull-down current sources 732 and 733, the voltage level of the fourth connection node N4 may be toward the level of the power voltage VDD. When the current of the second replica transistor 731 is higher than the currents of the first and/or second pull-down current sources 732 and 733, the voltage level of the fourth connection node N4 may be toward the level of the ground voltage VSS.

The flip-flop unit 740 may output first and second output signals OUT_PD and OUT_ND by latching the voltage levels of the third and fourth connection nodes N3 and N4 in response to a clock signal CK. The flip-flop unit 740 outputs the first and second output signals OUT_PD and OUT_ND at logic high levels for the third and fourth connection nodes N3 and N4 having the voltage levels toward the power voltage VDD output from the driving replica unit 710 and may output the first and second output signals OUT_PD and OUT_ND at logic low levels for the third and fourth connection nodes N3 and N4 having the voltage levels toward the ground voltage VSS. The first and second output signals OUT_PD and OUT_ND may be provided to the decision logic 750.

The decision logic 750 may output the switching signal SW, an up signal UP, and a down signal DN in response to logic levels of the first and second output signals OUT_PD and OUT_ND.

The up/down counter 760 may generate the offset code OFFSET<0:4> by performing an up-counting operation or a down-counting operation in accordance with the up signal UP or the down signal DN of the decision logic 750. The offset code OFFSET<0:4> may be generated in response to a falling edge of the clock signal CK that passes through the clock delay unit 770. The clock delay unit 770 may delay the clock signal CK to a degree of a time corresponding to an operation period of a temperature sensor included in the inside or outside of the memory device 100. The up/down counter 760 may be designed to generate the offset code OFFSET<0:4> for every operation period of the temperature sensor (e.g., for every operation period in which a temperature of the memory device 100 is sensed). The offset code OFFSET<0:4> is increased by the up-counting operation and may be reduced by the down-counting operation.

A correlation among the first and second replica circuits 720 and 730 of the driving replica unit 710, the first output signal OUT_PD and the second output signal OUT_ND of the flip-flop unit 740, the up signal UP and the down signal DN of the decision logic 750, and the up/down counter 760 will be described with reference to FIG. 8.

In FIG. 7, the first replica transistor 721 and the second replica transistor 731 may be individually affected by states of the first transistor PD and the second transistor ND of the driver 340. For example, the first transistor PD and the second transistor ND may be directly or indirectly affected by a micro-bridge phenomenon with a bit line BL and a word line WL. Therefore, in FIG. 8, first to eighth cases in accordance with the current levels of the first replica transistor 721 and the second replica transistor 731 are described.

In the first to fourth cases, a relationship between the current levels of the first replica transistor 721 and the second replica transistor 731 and reference currents IREF_PD and IREF_ND of about 5 μA, which flow to a default level by the first pull-up current source 722 and the first pull-down current source 732 is described.

In the first case, it is described that the logic levels of the first and second output signals OUT_PD and OUT_ND of the decision logic 750 are collectively "00". In the first replica circuit 720, when the current level of the first replica transistor 721 is lower than the current level 5 μA of the first pull-up current source 722, the first output signal OUT_PD of the flip-flop unit 740, which is at a logic low level, may be output. In the second replica circuit 730, when the current level of the second replica transistor 731 is higher than the current level 5 μA of the first pull-down current source 732, the second output signal OUT_ND of the flip-flop unit 740, which is at a logic low level, may be output. The decision logic 750 determines that the current levels of the first replica transistor 721 and the second replica transistor 731 are not higher than 5 μA and may output the up signal UP at a logic high level and the down signal DN at a logic low level in response to the logic levels "00" of the first and second output signals OUT_PD and OUT_ND. The up/down counter 760 may increase the offset code OFFSET<0:4> by performing the up-counting operation in response to the up signal UP at the logic high level.

In the second case, it is described that the logic levels of the first and second output signals OUT_PD and OUT_ND of the decision logic 750 are collectively "01". In the first replica circuit 720, when the current level of the first replica transistor 721 is lower than the current level 5 μA of the first pull-up current source 722, the first output signal OUT_PD of the flip-flop unit 740, which is at the logic low level, may be output. In the second replica circuit 730, when the current level of the second replica transistor 731 is lower than the current level 5 μA of the first pull-down current source 732, the second output signal OUT_ND of the flip-flop unit 740, which is at a logic high level, may be output. The decision logic 750 determines that the current levels of the first replica transistor 721 and the second replica transistor 731 are not higher than 5 μA and may output the up signal UP at the logic high level and the down signal DN at the logic low level in response to the logic levels "01" of the first and second output signals OUT_PD and OUT_ND. The up/down counter 760 may increase the offset code OFFSET<0:4> by performing the up-counting operation in response to the up signal UP at the logic high level.

In the third case, it is described that the logic levels of the first and second output signals OUT_PD and OUT_ND of the decision logic 750 are collectively "11". In the first replica circuit 720, when the current level of the first replica transistor 721 is higher than the current level 5 μA of the first pull-up current source 722, the first output signal OUT_PD of the flip-flop unit 740, which is at a logic high level, may be output. In the second replica circuit 730, when the current level of the second replica transistor 731 is lower than the current level 5 μA of the first pull-down current source 732, the second output signal OUT_ND of the flip-flop unit 740, which is at the logic high level, may be output. The decision logic 750 determines that the current levels of the first replica transistor 721 and the second replica transistor 731 are not higher than 5 μA and may output the up signal UP at the logic high level and the down signal DN at the logic low level in response to the logic levels "11" of the first and second output signals OUT_PD and OUT_ND. The up/down counter 760 may increase the offset code OFFSET<0:4> by performing the up-counting operation in response to the up signal UP at the logic high level.

In the fourth case, it is described that the logic levels of the first and second output signals OUT_PD and OUT_ND of the decision logic 750 are collectively "10". In the first replica circuit 720, when the current level of the first replica transistor 721 is higher than the current level 5 μA of the first pull-up current source 722, the first output signal OUT_PD of the flip-flop unit 740, which is at the logic high level, may be output. In the second replica circuit 730, when the current level of the second replica transistor 731 is higher than the current level 5 μA of the first pull-down current source 732, the second output signal OUT_ND of the flip-flop unit 740, which is at the logic low level, may be output. The decision logic 750 determines that the current levels of the first replica transistor 721 and the second replica transistor 731 are not higher than 5 μA, outputs the up signal UP at the logic low level and the down signal DN at the logic low level in response to the logic levels "10" of the first and second output signals OUT_PD and OUT_ND, and may output the switching signal SW at a logic high level. The up/down counter 760 may stop the up-counting operation and fix (i.e., hold constant) the offset code OFFSET<0:4> in response to the up signal UP at the logic low level. The replica unit 710 may further supply currents of the second pull-up current source 723 and the second pull-down current source 733 to the third connection node N3 and the fourth connection node N4 by turning on the first switch 724 and the second switch 734 in response to the switching signal SW at the logic high level. Therefore, the reference current IREF_PD of 15 μA may be sunken to the third connection node N3 by the first pull-up current source 722 and the second pull-up current source 723. The reference current IREF_PD of 15 μA may be supplied to the fourth connection node N4 by the first pull-down current source 732 and the second pull-down current source 733.

In the fifth to eighth cases, a relationship between the current levels of the first replica transistor 721 and the second replica transistor 731 and the reference currents IREF_PD and IREF_ND of about 15 μA, which flow through the first and second pull-up current sources 722 and 723 and the first and second pull-down current sources 732 and 733 is described.

In the fifth case, it is described that the logic levels of the first and second output signals OUT_PD and OUT_ND of the decision logic 750 are collectively "01". In the first replica circuit 720, when the current level of the first replica transistor 721 is lower than the current levels 15 μA of the first and second pull-up current sources 722 and 723, the first output signal OUT_PD of the flip-flop unit 740, which is at the logic low level, may be output. In the second replica circuit 730, when the current level of the second replica transistor 731 is lower than the current levels 15 μA of the first and second pull-down current sources 732 and 733, the second output signal OUT_ND of the flip-flop unit 740, which is at the logic high level, may be output. The decision logic 750 determines that the current levels of the first replica transistor 721 and the second replica transistor 731 are not higher than 15 μA. The up/down counter 760 may maintain the fixed offset code OFFSET<0:4>.

In the sixth case, it is described that the logic levels of the first and second output signals OUT_PD and OUT_ND of the decision logic 750 are collectively "00". In the first replica circuit 720, when the current level of the first replica transistor 721 is lower than the current levels 15 μA of the first and second pull-up current sources 722 and 723, the first output signal OUT_PD of the flip-flop unit 740, which is at the logic low level, may be output. In the second replica circuit 730, when the current level of the second replica transistor 731 is higher than the current levels 15 μA of the first and second pull-down current sources 732 and 733, the second output signal OUT_ND of the flip-flop unit 740, which is at the logic low level, may be output. The decision logic 750 determines that the current levels of the first replica transistor 721 and the second replica transistor 731 are not higher than 15 μA. The up/down counter 760 may maintain the fixed offset code OFFSET<0:4>.

In the seventh case, it is described that the logic levels of the first and second output signals OUT_PD and OUT_ND of the decision logic 750 are collectively "11". In the first replica circuit 720, when the current level of the first replica transistor 721 is higher than the current levels 15 μA of the first and second pull-up current sources 722 and 723, the first output signal OUT_PD of the flip-flop unit 740, which is at the logic high level, may be output. In the second replica circuit 730, when the current level of the second replica transistor 731 is lower than the current levels 15 μA of the first and second pull-down current sources 732 and 733, the second output signal OUT_ND of the flip-flop unit 740, which is at the logic high level, may be output. The decision logic 750 determines that the current levels of the first replica transistor 721 and the second replica transistor 731 are not higher than 15 μA. The up/down counter 760 may maintain the fixed offset code OFFSET<0:4>.

In the eighth case, it is described that the logic levels of the first and second output signals OUT_PD and OUT_ND of the decision logic 750 are collectively "10". In the first replica circuit 720, when the current level of the first replica transistor 721 is higher than the current levels 15 μA of the first and second pull-up current sources 722 and 723, the first output signal OUT_PD of the flip-flop unit 740, which is at the logic high level, may be output. In the second replica circuit 730, when the current level of the second replica transistor 731 is higher than the current levels 15 μA of the first and second pull-down current sources 732 and 733, the second output signal OUT_ND of the flip-flop unit 740, which is at the logic low level, may be output. The decision logic 750 determines that the current levels of the first replica transistor 721 and the second replica transistor 731 are not higher than 15 μA, outputs the up signal UP at the logic low level and the down signal DN at the logic high level in response to the logic levels "10" of the first and second output signals OUT_PD and OUT_ND, and may output the switching signal SW at the logic low level.

The up/down counter 760 may reduce the offset code OFFSET<0:4> by performing the down-counting operation in response to the down signal DN at the logic high level. The replica unit 710 may block a connection between the third connection node N3 and the second pull-up current source 723 and a connection between the fourth connection node N4 and the second pull-down current source 733 by turning off (e.g., opening) the first switch 724 and the second switch 734 in response to the switching signal SW at the logic low level. Therefore, the reference current IREF_PD of 5 μA is sunken to the third connection node N3 by the first pull-up current source 722 and the reference current IREF_ND of 5 μA may be supplied to the fourth connection node N4 by the first pull-down current source 732.

In the operations of the above-described first to eighth cases, since the currents that flow through the first replica transistor 721 and the second replica transistor 731 of the first and second replica circuits 720 and 730 replicate/model currents that flow through the first transistor PD and the second transistor ND of the driver 340, it will be understood that the reference currents IREF_PD and IREF_ND generated by the first and second pull-up current sources 722 and 723 and the first and second pull-down current sources 732 and 733 may actually be compared with the short current Ishort of the driver 340. For example, the short current Ishort (e.g., the target short current $I_{short\_target}$) may equal the collective (i.e., combined) current levels of the first replica transistor 721 and the second replica transistor 731.

Figure 9:
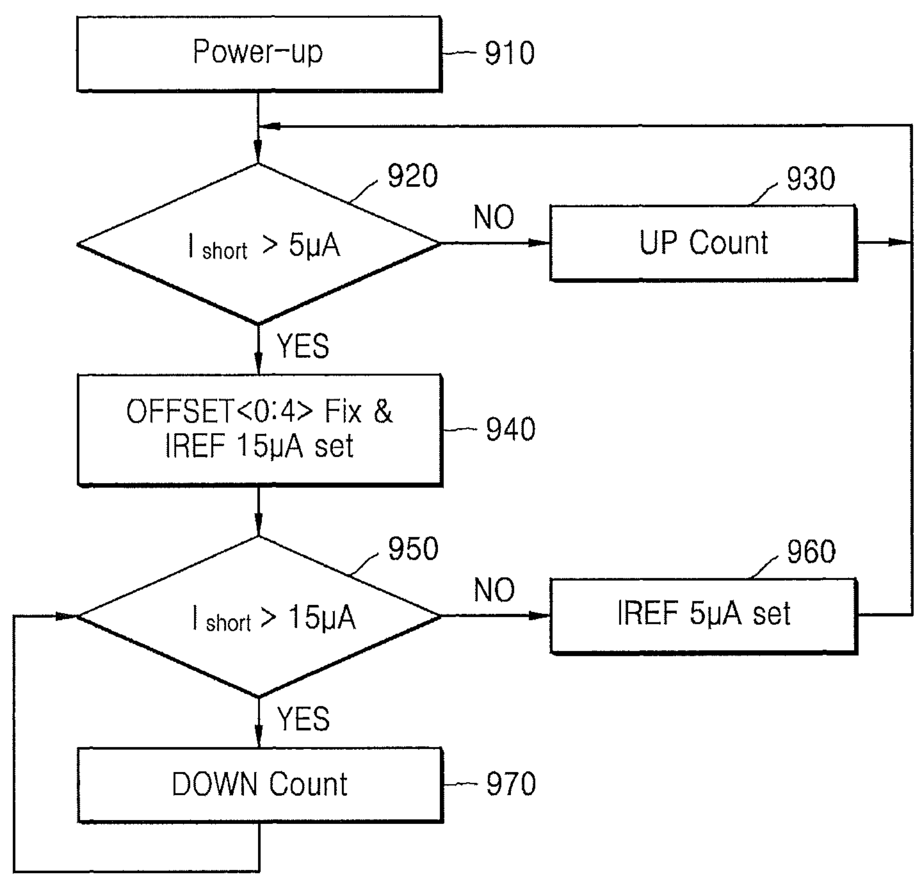
FIGS. 9 and 10 are a flowchart and a timing diagram illustrating an operation of the voltage generation circuit of FIG. 3.
Figure 10:
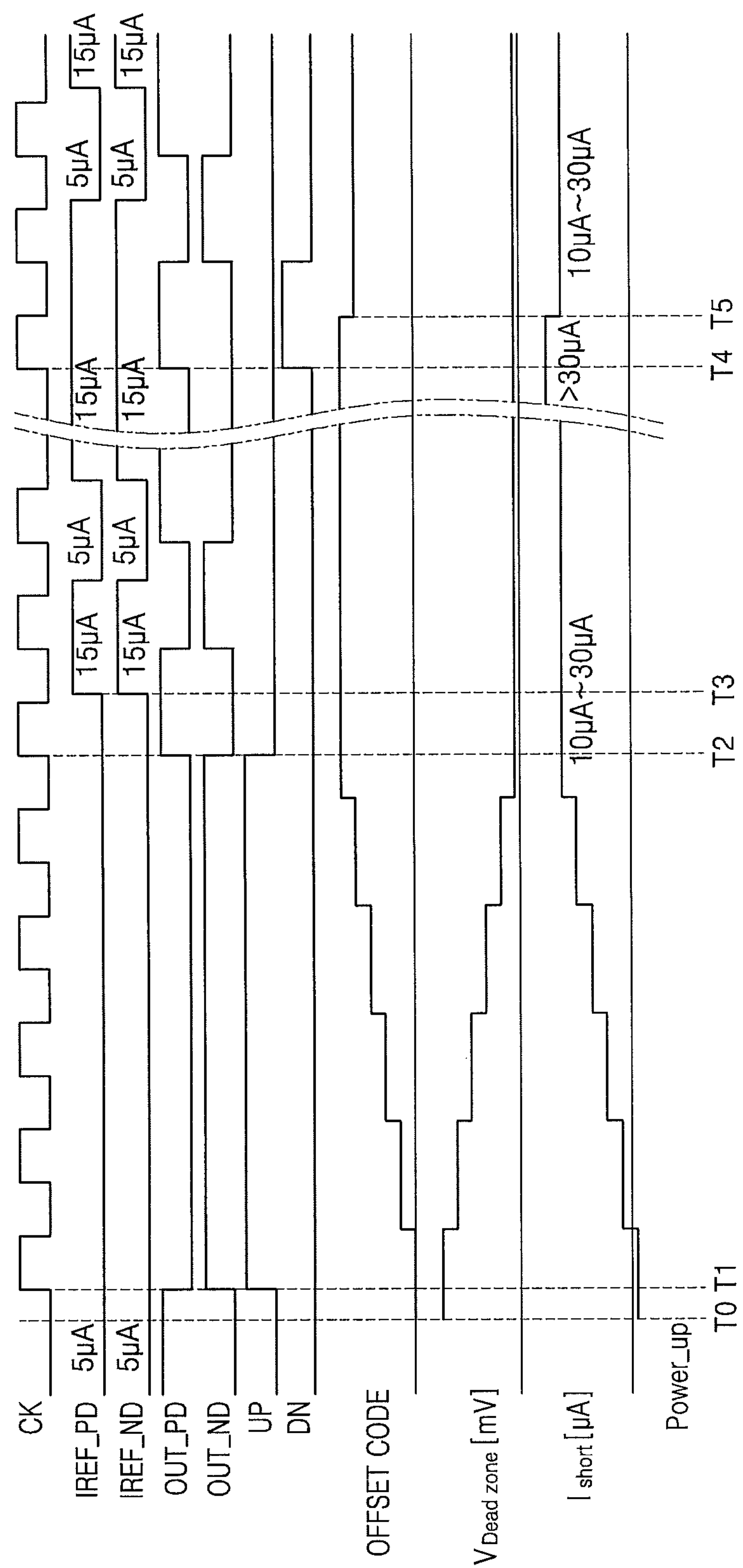
Figure 11:
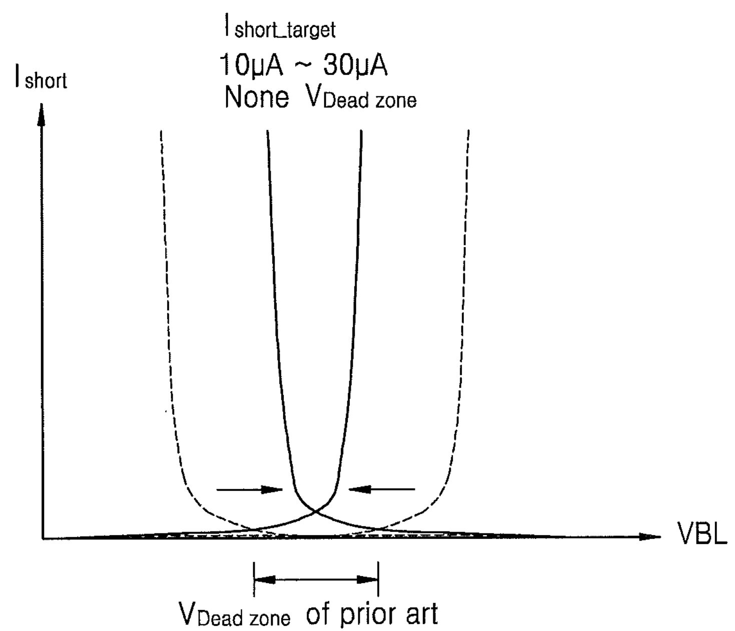
FIG. 11 is a graph illustrating an operation characteristic of the voltage generation circuit of FIG. 3.

FIGS. 9 and 10 are a flowchart and a timing diagram illustrating an operation of the voltage generation circuit 130 of FIG. 3. FIG. 11 is a graph illustrating an operation characteristic of the voltage generation circuit 130 of FIG. 3.

Referring to FIGS. 9 and 10, when the memory device 100 (FIG. 1) is powered up in operation 910, the voltage generation circuit 130 may operate (at a point in time T0).

In operation 920, the short current Ishort that flows through the first transistor PD and the second transistor ND of the driver 340 may be compared with the reference currents IREF_PD and IREF_ND of the replica unit 710. A level of the short current Ishort of the driver 340 is compared with a level of the reference current IREF_PD of 5 μA of the first pull-up current source 722 of the first replica circuit 720 and the level of the short current Ishort of the driver 340 may be compared with a level of the reference current IREF_ND of 5 μA of the first pull-down current source 732 of the second replica circuit 730. As a result of the comparison(s), when the level of the short current Ishort of the driver 340 is lower than the levels of the reference currents IREF_PD and IREF_ND of 5 μA of the first pull-up and pull-down current sources 722 and 732 of the first and second replica circuits 720 and 730, a process may proceed to operation 930. In operation 930, the first output signal OUT_PD of the flip-flop unit 740, which is at the logic low level, is output and the second output signal OUT_ND of the flip-flop unit 740, which is at the logic high level, may be output (at a point in time T1).

In accordance with the first output signal OUT_PD at the logic low level and the second output signal OUT_ND at the logic high level, a decision logic 750 outputs the up signal UP at the logic high level and an up/down counter 760 may perform the up-counting operation. The offset code OFFSET<0:4> may be increased by the up-counting operation of the up/down counter 760.

The increased offset code OFFSET<0:4> may be provided to the offset compensator 320. The level of the short current Ishort of the driver 340 may be increased by an operation of the comparator 330 linked to the offset compensator 320 in accordance with the increased offset code OFFSET<0:4>. At this time, a dead zone voltage $V_{DEAD\ ZONE}$ of the bit line pre-charge voltage VBL output from the driver 340 may be reduced. Operation 920 and operation 930 may be repeatedly performed until the level of the short current Ishort of the driver 340 is no less than (i.e., is higher than or equal to) the reference currents IREF_PD and IREF_ND of 5 μA of the first pull-up and pull-down current sources 722 and 732 of the first and second replica circuits 720 and 730 (at a point in time T2).

As a result of the comparison(s) of operation 920, when the level of the short current Ishort of the driver 340 is higher than the levels of the reference currents IREF_PD and IREF_ND of 5 μA of the first pull-up and pull-down current sources 722 and 732 of the first and second replica circuits 720 and 730, a process may proceed to operation 940.

In operation 940, when the level of the short current Ishort of the driver 340 is no less than the levels of the reference currents IREF_PD and IREF_ND of 5 μA of the first pull-up and pull-down current sources 722 and 732 of the first and second replica circuits 720 and 730, the first output signal OUT_PD of the flip-flop unit 740, which is at the logic high level, is output and the second output signal OUT_ND of the flip-flop unit 740, which is at the logic low level, may be output (at a point in time T2).

Here, sizes of the first and second replica transistors 721 and 731 of the first and second replica circuits 720 and 730 may be designed to be about halves (½) of sizes of the first and second transistors PD and ND of the driver 340. Therefore, the short current Ishort of the driver 340 may be about 10 μA, which is twice the reference currents IREF_PD and IREF_ND of 5 μA of the first and second replica circuits 720 and 730.

The decision logic 750 may output the up signal UP at the logic low level and the down signal DN at the logic low level in response to the logic levels "10" of the first and second output signals OUT_PD and OUT_ND. The up/down counter 760 stops the up-counting operation in response to the up signal UP at the logic low level and may fix (i.e., hold constant) the offset code OFFSET<0:4> (at a point in time T3).

Then, in operation 940, the level of the reference current IREF_PD may be set to be 15 μA by adding the current level of 10 μA of the second pull-up current source 723 to the current level of 5 μA of the first pull-up current source 722 by turning on the first switch 724 of the first replica circuit 720 and the level of the reference current IREF_ND may be set to be 15 μA by adding the current level of 10 μA of the second pull-down current source 733 to the current level of 5 μA of the first pull-down current source 732 by turning on the second switch 734 of the second replica circuit 730.

In operation 950, the level of the short current Ishort of the driver 340 is compared with the level of the reference current IREF_PD of 15 μA of the first replica circuit 720 and the level of the short current Ishort of the driver 340 may be compared with the level of the reference current IREF_ND of 15 μA of the second replica circuit 730. As a result of the comparison(s), when the level of the short current Ishort of the driver 340 is lower than the levels of the reference currents IREF_PD and IREF_ND of 15 μA of the first and second replica circuits 720 and 730, a process may proceed to operation 960. At this time, since the short current Ishort of the driver 340 is lower than the reference currents IREF_PD and IREF_ND of 15 μA, the short current Ishort of the driver 340 may be lower than 30 μA, which is twice the reference currents IREF_PD and IREF_ND of 15 μA of the first and second replica circuits 720 and 730.

In operation 960, the levels of the reference currents IREF_PD and IREF_ND of the first and second replica circuits 720 and 730 may be set to be 5 μA. Then, a process proceeds to operation 920 and it may be determined whether the level of the short current Ishort of the driver 340 is higher than the levels of the reference currents IREF_PD and IREF_ND of 5 μA of the first pull-up and pull-down current sources 722 and 732 of the first and second replica circuits 720 and 730. As a result of the comparison(s), when the level of the short current Ishort of the driver 340 is higher than the levels of the reference currents IREF_PD and IREF_ND of 5 μA, a process may proceed to operation 940. The fixed offset code OFFSET<0:4> is maintained and the levels of the reference currents IREF_PD and IREF_ND of the first and second replica circuits 720 and 730 may be set to be 15 μA. In operation 950, it may be determined whether the level of the short current Ishort of the driver 340 is higher than the levels of the reference currents IREF_PD and IREF_ND of 15 μA of the first pull-up and pull-down current sources 722 and 732 of the first and second replica circuits 720 and 730. As a result of the comparison(s), when the level of the short current Ishort of the driver 340 is lower than the levels of the reference currents IREF_PD and IREF_ND of 15 μA, a process may proceed to operation 960.

In a period from the point in time T2 to a point in time T4, in which it is determined that the level of the short current Ishort of the driver 340 is higher than the levels of the reference currents IREF_PD and IREF_ND of 5 μA in operation 920 and that the level of the short current Ishort of the driver 340 is lower than the levels of the reference currents IREF_PD and IREF_ND of 15 μA in operation 950, the level of the short current Ishort of the driver 340 may be about 10 μA to 30 μA as the target short current $I_{short\_target}$. At this time, as the level of the short current Ishort of the driver 340 is changed to and compared with the levels of the reference currents IREF_PD and IREF_ND of 5 μA or 15 μA, it is possible to prevent/impede a bang-bang jitter from being generated by linear search in which the target short current $I_{short\_target}$ of the driver 340 is sequentially searched from the beginning.

As the comparison result of operation 950, when the level of the short current Ishort of the driver 340 is no less than the levels of the reference currents IREF_PD and IREF_ND of 15 μA of the first and second replica circuits 720 and 730, a process may proceed to operation 970 (at the point in time T4).

In operation 970, when the level of the short current Ishort of the driver 340 is no less than the levels of the reference currents IREF_PD and IREF_ND of 15 μA of the first and second replica circuits 720 and 730, the first output signal OUT_PD of the flip-flop unit 740, which is at the logic high level, may be output and the second output signal OUT_ND of the flip-flop unit 740, which is at the logic low level, may be output (at the point in time T4). At this time, the level of the short current Ishort of the driver 340 may be no less than 30 μA.

The decision logic 750 may output the up signal UP at the logic low level and the down signal DN at the logic high level in response to the collective logic levels "10" of the first and second output signals OUT_PD and OUT_ND. The up/down counter 760 may perform the down-counting operation in response to the down signal DN at the logic high level. The offset code OFFSET<0:4> may be reduced by the down-counting operation of the up/down counter 760 (at a point in time T5).

The reduced offset code OFFSET<0:4> is provided to the offset compensator 320 and the level of the short current Ishort of the driver 340 may be reduced by operations of the comparator 330 and the driver 340 that are linked to the offset compensator 320. Operations S950 and S970 may be repeatedly performed until the level of the short current Ishort of the driver 340 is no more than 30 μA.

In the bit line pre-charge voltage generating method described in FIGS. 9 and 10, background calibration is performed so that the target short current $I_{short\_target}$ of about 10 μA to 30 μA uniformly flows through the driver 340 and accordingly, the bit line pre-charge voltage VBL without the dead zone may be generated as illustrated in FIG. 11. Therefore, the distribution of the bit line pre-charge voltage VBL is minimized/reduced and accordingly, the sensing margin of the memory cell data may be secured.

Though the inventive concepts have been particularly shown and described with reference to example embodiments thereof, it will be understood that various changes in form and details may be made therein without departing from the scope of the following claims.

What is claimed is:

1. A voltage generation circuit configured to generate a bit line pre-charge voltage, the voltage generation circuit comprising:

an offset compensator configured to receive a reference voltage and an offset code and to link the offset code to the reference voltage;

a comparator configured to compare the reference voltage linked to the offset code with the bit line pre-charge voltage and to output first and second driving control signals;

a driver configured to output the bit line pre-charge voltage at a target level of the reference voltage in response to the first and second driving control signals; and a background calibration circuit configured to generate the offset code for performing control so that a target short current flows through an output node of the driver from which the bit line pre-charge voltage is output in response to the first and second driving control signals.

2. The voltage generation circuit of claim 1, wherein the driver comprises:

a first transistor connected between a power voltage and the output node and configured to pull-up drive the output node in response to the first driving control signal; and a second transistor connected between the output node and a ground voltage and configured to pull-down drive the output node in response to the second driving control signal.

3. The voltage generation circuit of claim 2, wherein the background calibration circuit comprises:

a first replica circuit including a first replica transistor that models the first transistor, wherein the first replica circuit is configured to provide a first reference current or a second reference current to a first connection node between the first replica transistor and a first current source by controlling a level of the first reference current or a level of the second reference current that is higher than the level of the first reference current by using the first current source;

a second replica circuit including a second replica transistor that models the second transistor, wherein the second replica circuit is configured to provide the first or second reference current to a second connection node between the second replica transistor and a second current source by controlling the level of the first reference current or the level of the second reference current by using the second current source; and an up/down counter configured to output the offset code by performing an up-counting operation or a down-counting operation based on voltage levels of the first connection node and the second connection node.

4. The voltage generation circuit of claim 3, wherein the background calibration circuit further comprises a decision logic connected to the first and second connection nodes and configured to generate an up signal for performing the up-counting operation or a down signal for performing the down-counting operation by comparing current levels of the first and second replica transistors with the level of the first reference current or the level of the second reference current and to output the up signal or the down signal to the up/down counter.

5. The voltage generation circuit of claim 4, wherein the decision logic is further configured to output the up signal until the current levels of the first and second replica transistors are higher than the level of the first reference current.

6. The voltage generation circuit of claim 5, wherein the decision logic is further configured to stop an operation of the up/down counter and to hold the offset code constant when the current levels of the first and second replica transistors are higher than the level of the first reference current.

7. The voltage generation circuit of claim 6, wherein the decision logic is further configured to hold the offset code constant when the current levels of the first and second replica transistors are higher than the level of the first reference current and lower than the level of the second reference current.

8. The voltage generation circuit of claim 4, wherein the decision logic is further configured to output the down signal when the current levels of the first and second replica transistors are higher than the level of the second reference current.

9. The voltage generation circuit of claim 3, wherein the target short current that flows through the output node of the driver is based on the level of the first reference current and the level of the second reference current.

10. The voltage generation circuit of claim 3, wherein the target short current that flows through the output node of the driver is based on a size ratio between the first and second transistors and the first and second replica transistors, wherein the first and second transistors are larger than the first and second replica transistors, and wherein the target short current equals the current levels of the first and second replica transistors collectively.

11. The voltage generation circuit of claim 1, further comprising:

a first resistor and a second resistor connected between a power voltage and a ground voltage; and a reference voltage generator configured to output the reference voltage at a connection node between the first resistor and the second resistor.

12. A memory device comprising:

a bit line sense amplifier configured to precharge a bit line and a complementary bit line by a bit line pre-charge voltage and amplify a voltage difference between the bit line and the complementary bit line; and a voltage generation circuit configured to generate the bit line pre-charge voltage, wherein the voltage generation circuit comprises:

an offset compensator configured to receive a reference voltage and an offset code and to link the offset code to the reference voltage;

a comparator configured to compare the reference voltage linked to the offset code with the bit line pre-charge voltage and to output first and second driving control signals;

a driver configured to output the bit line pre-charge voltage at a target level of the reference voltage in response to the first and second driving control signals; and a background calibration circuit configured to generate the offset code for performing control so that a target short current flows through an output node of the driver from which the bit line pre-charge voltage is output in response to the first and second driving control signals.

13. The memory device of claim 12, wherein the driver comprises:

a first transistor connected between a power voltage and the output node and configured to pull-up drive the output node in response to the first driving control signal; and a second transistor connected between the output node and a ground voltage and configured to pull-down drive the output node in response to the second driving control signal.

14. The memory device of claim 13, wherein the background calibration circuit comprises:

a first replica circuit including a first replica transistor that models the first transistor, wherein the first replica circuit is configured to provide a first reference current or a second reference current to a first connection node between the first replica transistor and a first current source by controlling a level of the first reference current or a level of the second reference current that is higher than the level of the first reference current by using the first current source;

a second replica circuit including a second replica transistor that models the second transistor, wherein the second replica circuit is configured to provide the first or second reference current to a second connection node between the second replica transistor and a second current source by controlling the level of the first reference current or the second reference current by using the second current source; and an up/down counter configured to output the offset code by performing an up-counting operation or a down-counting operation based on voltage levels of the first connection node and the second connection node.

15. The memory device of claim 14, wherein the target short current that flows through the output node of the driver is based on the level of the first reference current and the level of the second reference current.

16. The memory device of claim 14, wherein the target short current that flows through the output node of the driver is based on a size ratio between the first and second transistors and the first and second replica transistors.

17. The memory device of claim 12, wherein the background calibration circuit is further configured to generate the offset code for every operation period in which a temperature of the memory device is sensed.

18. A method of generating a bit line pre-charge voltage used for pre-charging a bit line and a complementary bit line of a memory device, the method comprising:

comparing current levels of first and second replica transistors that model a pull-up transistor and a pull-down transistor of a driver configured to output the bit line pre-charge voltage at a level of a first reference current;

increasing an offset code by performing an up-counting operation until the current levels of the first and second replica transistors are higher than the level of the first reference current and then holding the offset code constant;

comparing the current levels of the first and second replica transistors with a level of a second reference current that is higher than the level of the first reference current;

further holding the offset code constant when the current levels of the first and second replica transistors are higher than the level of the first reference current and lower than the level of the second reference current;

reducing the offset code by performing a down-counting operation when the current levels of the first and second replica transistors are higher than the level of the second reference current; and generating the bit line pre-charge voltage based on a reference voltage linked to the offset code.

19. The method of claim 18, wherein a target short current that flows through an output node of the driver is based on a size ratio between the pull-up and pull-down transistors and the first and second replica transistors, and wherein the target short current equals the current levels of the first and second replica transistors collectively.

20. The method of claim 18, further comprising generating the offset code for every operation period in which a temperature of the memory device is sensed.

* * * * *